United States Patent [19]

Takahashi et al.

[11] Patent Number: 4,721,657
[45] Date of Patent: Jan. 26, 1988

[54] ANTI-REFLECTION COATING FOR AN INFRARED TRANSMITTING MATERIAL

[75] Inventors: Kenichi Takahashi; Noriyuki Yoshida, both of Osaka, Japan

[73] Assignee: Sumitomo Electric Industries, Ltd., Osaka, Japan

[21] Appl. No.: 858,835

[22] Filed: Apr. 29, 1986

Related U.S. Application Data

[63] Continuation of Ser. No. 673,175, Nov. 19, 1984, abandoned.

[30] Foreign Application Priority Data

Dec. 12, 1983 [JP] Japan .................................. 58-232647

[51] Int. Cl.$^4$ .......................... B32B 9/00; B32B 19/00
[52] U.S. Cl. ..................................... 428/689; 427/160; 427/255.7; 427/419.1; 428/696; 428/699; 428/700; 428/913
[58] Field of Search ..................... 427/160, 162, 248.1, 427/255.7, 250, 419.1, 404; 428/446, 696, 697, 699, 689, 700, 913, 379, 380; 350/1.1, 164, 165, 166

[56] References Cited

U.S. PATENT DOCUMENTS

| | | | |
|---|---|---|---|
| 3,614,188 | 10/1971 | Seeley et al. | 427/160 |
| 3,733,217 | 5/1973 | Seeley et al. | 427/160 |
| 3,804,491 | 4/1974 | Morokuma et al. | 427/160 |
| 3,901,997 | 8/1975 | Groth | 427/160 |
| 3,959,548 | 5/1976 | Bernal | 427/160 |
| 4,110,489 | 8/1978 | Chaffin et al. | 427/160 |
| 4,176,207 | 11/1979 | Moravec et al. | 427/160 |

OTHER PUBLICATIONS

Dobrowolski et al, "High Performance Step-Down AR Coatings for High Refractive-Index IR Materials", Applied Optics vol. 21, No. 2, Jan. 15, 1982, pp. 288-292.

Rudisill et al, "Optical Coatings for High Energy ZnSe Laser Windows", Applied Optics, vol. 13, No. 9, pp. 2075-2080, Sep. 1974.

McLachlan, "Two-Layer Low-Absorption Antireflection Coating for KCL", Applied Optics, vol. 17, No. 3, Feb. 1978, pp. 447-450.

Sherman et al, "Antireflection Coatings for Silicon in the 2.5-50 um Region", Applied Optics, vol. 10, No. 12, pp. 2675-2678, Dec. 1971.

Boord et al, "Low Absorption TLI/KCL/TLI Antireflection Coatings for KCL Surfaces", Optical Engineering, vol. 18, No. 6, pp. 586-590, Dec. 1979.

Horrigan et al, "Windows for High-Power Lasers", Laser Technology Section, pp. 68-76, Jan. 1969.

*Primary Examiner*—Sadie L. Childs
*Attorney, Agent, or Firm*—Wenderoth, Lind & Ponack

[57] ABSTRACT

An anti-reflection coating for an infrared transmitting material, which is stable to water or moisture and free from deterioration of the performances for a long period of time, can be provided. This anti-reflection coating comprises an inner layer of an alkali metal halide and an outer layer, provided thereon, of an infrared transmitting material, the inner layer and outer layer being provided on a substrate of an infrared transmitting material and having refractive indexes in the range of shaded portion in FIG. 2, said refractive indexes of the inner and outer layer being based upon the refractive index n of the infrared transmitting substrate.

1 Claim, 2 Drawing Figures

ANTI-REFLECTION COATING FOR AN INFRARED TRANSMITTING MATERIAL

This application is a continuation of now abandoned application Ser. No. 673,175, filed Nov. 19, 1984, now abandoned.

BACKGROUND OF THE INVENTION

1. Field of the Invention

This invention relates to an anti-reflection coating for an infrared transmitting material and more particularly, it is concerned with an anti-reflection coating film provided for inhibiting the loss due to reflection in an infrared transmitting material.

2. Description of the Prior Art

Crystalline materials, for example, silver halides such as silver bromide and silver chloride, thallium halides such as KRS-5 and KRS-6 and alkali halides such as cesium iodide and cesium bromide, well known as infrared transmitting materials, have been considered full of promise as $CO_2$ laser beam transmitting window materials or $CO_2$ laser beam transmitting fibers. However, these materials each have a large refractive index at a wavelength of 10.6 $\mu$m of $CO_2$ laser beam and accordingly, the incident beam on the surface has a large reflectivity. In Table 1 are shown the refractive indexes and reflectivities of these materials at a wavelength of 10.6 $\mu$m of $CO_2$ laser beam:

TABLE 1

| Materials | Refractive Index n | Reflectivity (%) | $\sqrt{n}$ |
|---|---|---|---|
| Silver Bromide | 2.17 | 13.6 | 1.47 |
| Silver chloride | 1.98 | 10.8 | 1.41 |
| KRS-5* | 2.37 | 16.5 | 1.54 |
| KRS-6* | 2.17 | 13.6 | 1.47 |
| Cesium Iodide | 1.74 | 7.3 | 1.32 |

Note:
*KRS-5(commercial name): mixed crystal 45.7% TlBr + 54.3% TlI
KRS-6(commercial name): mixed crystal of 40% TlBr + 60% TlCl These materials have a reflectivity of more than 7. Thus, it is important to reduce the reflective loss and to raise the transmission of a window or fiber. As a method of reducing the reflective loss, it is known to form a non-reflective coating film. In the non-reflective coating monolayer, the reflectivity can be made zero by forming on the surface of a substrate a coating film consisting of a material with a refractive index equal to the square root $\sqrt{n}$ of the refractive index n of the substrate to give a thickness of $d = \lambda/4n$ wherein $\lambda$ is the wavelength of a transmitted light. The square root $\sqrt{n}$ of the refractive index of the above described materials is in the range of 1.3 to 1.6 as shown in Table 1. As a material transparent in the infrared region and having a refractive index of 1.3 to 1.6, there are potassium bromide, potassium chloride, sodium chloride, sodium fluoride, calcium fluoride and barium fluoride. These materials each have a refractive index and absorption coefficient at a wavelength of 10.6 $\mu$m, as shown in Table 2:

TABLE 2

| Material | Refractive Index | Absorption Coefficient $cm^{-1}$ |
|---|---|---|
| Potassium Bromide | 1.53 | $4.2 \times 10^{-4}$ |
| Potassium Chloride | 1.45 | $1.4 \times 10^{-4}$ |
| Sodium Chloride | 1.49 | $4.5 \times 10^{-4}$ |
| Sodium Fluoride | 1.23 | $5 \times 10^{-2}$ |
| Calcium Fluoride | 1.31 | 3.5 |
| Barium Fluoride | 1.42 | 0.19 |

The reflectivity can be decreased to less than about 3% by forming a film of these materials with a thickness of $\lambda/4n$ on the surface of silver bromide, silver chloride, KRS-5, KRS-6 or cesium iodide. However, calcium fluoride and barium fluoride each having a relatively large absorption coefficient as shown in Table 2 are not suitable for use in transmitting high output $CO_2$ laser beam, since their coatings tend to be damaged due to absorption. On the other hand, potassium bromide, potassium chloride, sodium chloride and sodium fluoride are all deliquescent although their absorption coefficients are sufficiently small, so the coatings thereof tend to take moisture in the air and to be readily decomposed and cannot be used as an anti-reflection coating in stable manner for a long time.

SUMMARY OF THE INVENTION

It is an object of the present invention to provide an anti-reflection coating for an infrared transmitting material, whereby the above described drawbacks of the prior art can be overcome.

It is another object of the present invention to provide an anti-reflection coating film capable of decreasing the reflective loss of an infrared transmitting material.

It is a further object of the present invention to provide an anti-reflection coating capable of preventing an infrared transmitting material such as silver bromide or silver chloride from decrease of transmission of light.

It is a still further object of the present invention to provide an infrared transmitting material provided with an anti-reflection double layer.

These objects can be attained by an anti-reflection coating for an infrared transmitting material comprising two layers of an inner layer of an alkali metal halide and an outer layer, provided thereon, of an infrared transmitting material, the refractive indexes of the inner layer and outer layer being in the range of shaded portion in FIG. 2 represented by the refractive index n of a substrate of an infrared transmitting material.

BRIEF DESCRIPTION OF THE DRAWINGS

The accompanying drawings are to illustrative the principle and merits of the present invention in greater detail.

DETAILED DESCRIPTION OF THE INVENTION

The present invention is based on finding that a coating consisting of a material capable of reducing the reflective loss but having a large solubility in water, such as potassium bromide, potassium chloride, sodium fluoride or sodium chloride, is covered with another coating consisting of an infrared transmitting material stable to water, whereby the inner layer is protected from water and the outer protective layer is caused to play a role as the outer layer of an anti-reflection double layer, not so as to decrease the anti-reflection effect. Furthermore, the present invention aims at preventing a substrate of silver bromide or silver chloride itself from decrease of the transmission of light by protecting the substrate from irradiation of visible rays and ultraviolet rays using a material opaque to visible rays and ultraviolet rays as the outer layer, since silver bromide or silver chloride has a tendency of decomposing under irradiation of visible rays and ultraviolet rays.

Figure 2:
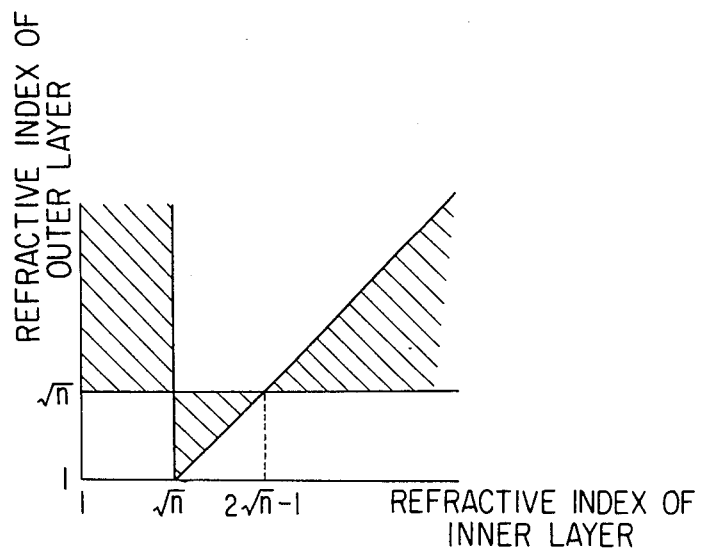
FIG. 2 is a graph showing the condition under which the reflectivity is zero in the case of providing a substrate with two layers of anti-reflection coatings.

Accordingly, the present invention provides an anti-reflection coating film for an infrared transmitting material, consisting essentially of an inner layer of an alkali metal halide and an outer layer, provided on the inner layer, of an infrared transmitting material, the inner layer and outer layer being provided on a substrate of the infrared transmitting material and having refractive indexes in the range of shaded portion in FIG. 2, represented by the refractive index n of the substrate. Generally, this anti-reflection coating is provided on the surface of a substrate consisting of an infrared transmitting material such as silver halides, thallium halides and alkali metal halides, or on the input or output end of an infrared fiber consisting of the same material.

In the case of an anti-reflection coating of double layer, in general, it is known that the reflectivity can be zero when the combination of refractive indexes of the inner layer and outer layer is in the range of shaded portion of FIG. 2 in connection with relationship with the refractove index n of a substrate (K. Schuster, Ann. Phys., Sixth Ser. 4 352 (1949)).

In the present invention, as the substrate, there are used infrared transmitting materials having refractive indexes n as shown in Table 1, $\sqrt{n}$ being in the range of 1.3 to 1.6, for example, silver halides such as silver bromide, silver chloride and mixed crystals thereof, thallium halides such as thallium chloride, thallium bromide, thallium iodide and mixed crystals thereof and alkali metal halides such as cesium iodide, cesium bromide and mixed crystals thereof. As the inner layer of the anti-reflection coating provided on such a substrate, there are used alkali metal halides whose refractive index is in the same range as the above described $\sqrt{n}$, while as the outer layer of the anti-reflection coating, there are used infrared transmitting materials which are stable to water and whose refractive indexes are, in combination with the refractive index of the inner layer, in the range of shaded portion of FIG. 2, whereby to make the reflectivity zero, for example, silver bromide, silver chloride and mixed crystals thereof, thallium chloride, thallium bromide, thallium iodide and mixed crystals thereof, lead fluoride, zinc sulfide, zinc selenide and the like. In addition, germanium, silicon, cadmium telluride and gallium arsenide, which are stable to water and capable of forming a hard film opaque to visible rays and ultraviolet rays, are also suitable for use as a material for the outer layer as set forth above, and when using these materials, the effect of preventing the substrate from decomposition due to visible rays and ultraviolet rays can be given.

The inner layer and outer layer can be provided on a substrate, for example, by vapor deposition method.

The refractive indexes at a wavelength of 10.6 μm and transmitting wavelength region of the outer layer materials are shown in Table 3:

TABLE 3

| Outer Layer Material | Refractive Index | Trasmitting Wavelength Region (μm) |
|---|---|---|
| Silver Bromide | 2.17 | 0.5–30.0 |
| Silver Chloride | 1.98 | 0.4–30.0 |
| KRS-5 | 2.37 | 0.5–40.0 |
| KRS-6 | 2.17 | 2.0–20.0 |
| Lead Fluoride | 2.18 | 0.3–10.0 |
| Zinc Sulfide | 2.20 | 0.5–15 |
| Zinc Selenide | 2.42 | 0.5–25 |
| Germanium | 4.00 | 1.8–22 |
| Silicon | 3.42 | 1.2–13 |
| Cadmium Telluride | 2.67 | 0.91–15 |
| Gallium Arsenide | 3.10 | 1.0–11 |

The materials described in Table 3 are all stable to water or moisture and capable of forming a protective layer for a deliquescent inner layer. Above all, germanium, silicon, cadmium telluride and gallium arsenide do not permit visible rays or ultraviolet rays and when using these materials as an outer layer material in the non-reflective coating for light-sensitive materials such as silver chloride and silver bromide, therefore, a substrate of silver chloride or silver bromide can effectively be protected from decomposition.

As the coating material of an inner layer and outer layer, there can be used any combination of the alkali metal halides described in Table 2 and the materials described in Table 3, which have refractive indexes in the range of shaded portion of FIG. 2.

The following examples are given in order to illustrate the present invention in detail without limiting the same.

EXAMPLE 1

Figure 1:
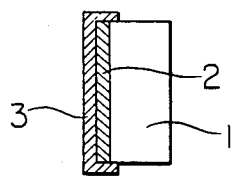
FIG. 1 is a cross-sectional view of one embodiment of an infrared transmitting material provided with an anti-reflection coating according to the present invention.

Referring to FIG. 1, silver bromide crystal plate 1 is provided with an anti-reflection coating consisting of inner layer 2 of potassium chloride and outer layer 3 of silver bromide by vacuum vapor deposition method. As to the refractive indexes of the substrate and the inner layer and outer layer of the anti-reflection coating, silver bromide has a refractive index n of 2.17, $\sqrt{n}$ being 1.47, so the combination of potassium chloride of inner layer 2 (refractive index at a wavelength of 10.6 μm=1.45) and silver bromide of outer layer 3 (refractive index at a wavelength of 10.6 μm=2.17) is in the range of shaded portion of FIG. 2 to thus make the reflectivity zero.

Since inner layer 2 of FIG. 1, consisting of deliquescent potassium chloride, is completely covered with outer layer 3 consisting of silver bromide being stable to moisture, the anti-reflection coating is stable to moisture and capable of maintaining the initial nonreflective effect for a long period of time without being decomposed.

The film thickness of the each layer can be determined by the following conditions ("Usumaku Kogaku (Thin Film Engineering) Handbook" published by Ohm Co., p-II-297):

$$A + nB - C - nD = 0$$

Herein, $$A = \cos \delta_1 \cos \delta_2 - \frac{n_2}{n_1} \sin \delta_1 \sin \delta_2$$

-continued $$B = i\left(\frac{1}{n_2}\cos\delta_1\sin\delta_2 + \frac{1}{n_1}\sin\delta_1\cos\delta_2\right)$$

$$C = i(n_1\sin\delta_1\cos\delta_2 + n_2\cos\delta_1\sin\delta_2)$$

$$D = \frac{n_1}{n_2}\sin\delta_1\sin\delta_2 + \cos\delta_1\cos\delta_2 \ (i = \sqrt{-1}\ )$$

$$\delta_1 = \frac{2\pi}{\lambda}n_1d_1 \ (n_1, d_1: \text{refractive index, film thickness of outer layer})$$

$$\delta_2 = \frac{2\pi}{\lambda}n_2d_2 \ (n_2, d_2: \text{refractive index, film thickness of inner layer})$$

($\lambda$: wavelength of light used)

In this Example, the inner layer was provided in a thickness of 1.82 $\mu$m and the outer layer, in a thickness of 2.41 $\mu$m to give a reflectivity of less than 1%.

For the purpose of examining the effect of this double layer coating, the similar silver bromide crystal plate was coated with only one layer of potassium chloride with a thickness of 1.82 $\mu$m by vacuum vapor deposition method and compared with the above described double layer coating.

In the case of the monolayer coating, the reflectivity was only less than 1% immediately after the coating, but after allowed to stand in a humidity of 60% at room temperature for two days, the coating film became slightly opaque and the transmission of $CO_2$ laser beam was lowered from the initial 99% to 80%. In the case of the double layer coating of this Example, on the other hand, the transmission of $CO_2$ laser beam was maintained at the initial value of 99% or more for one month or longer under the same standing condition.

EXAMPLE 2

As shown in FIG. 1, the input and output end of silver bromide crystal fiber 1 is provided with an anti-reflection coating consisting of inner layer 2 of potassium chloride and outer layer 3 of cadmium telluride by vacuum vapor deposition. It is apparent from FIG. 2 that the combination of potassium chloride with cadmium telluride having a refractive index of 2.67 at a wavelength of 10.6 $\mu$m, as the outer layer, results in a reflectivity of zero.

In this Example, the inner layer was provided in a thickness of 1.82 $\mu$m and the outer layer was provided in a thickness of 2.10 $\mu$m.

In this Example, not only potassium chloride of inner layer 2 was protected from decomposition due to water by cadmium telluride of outer layer 3 in the similar manner to Example 1, but also silver bromide crystal of substrate fiber 1 was protected from decomposition due to visible rays and ultraviolet rays. That is, cadmium telluride of outer layer 3 has a transmitting wavelength region of 0.9 to 15 $\mu$m and is opaque to visible rays and ultraviolet rays, so incident visible rays or ultraviolet rays are intercepted by outer layer 3 and there takes place no decomposition of silver bromide crystal of substrate fiber 1 due to visible rays or ultraviolet rays. Thus, this anti-reflection coating can not only maintain the initial performance against moisture for a long period of time, but also serve as a cut filter of visible rays and ultraviolet rays for the substrate material.

Comparative data of this Example with a monolayer coating of potassium chloride are as follows:

When allowed to stand in a humidity of 60% at room temperature for a long time in an analogous manner to Example 1, the double layer coating of this Example maintained the transmission of $CO_2$ laser beam at the initial value of 99% or more for one month or longer.

When the input and output end of silver bromide crystal fiber 1 coated with potassium chloride/cadmium talluride films according to the present invention was allowed to stand in the open air of fine weather for one day, there was no change in the transmission of $CO_2$ laser beam, while in the case of another silver bromide crystal fiber coated with a monolayer coating of potassium chloride for comparison, the silver bromide crystal was sensitized by the visible rays and ultraviolet rays of the sunlight and turned black to lower the transmission of $CO_2$ laser beam to 20% after allowed to stand for two hours under the similar conditions.

EXAMPLE 3

The stability of anti-reflection coatings for infrared transmitting materials, obtained in an analogous manner to Example 1 except changing the materials of the substrate, inner layer and outer layer as shown in Table 4, was examined, thus obtaining results as shown in Table 4:

TABLE 4

| Substrate | Inner Layer (Film Thickness) | | Outer Layer (Film Thickness) | | Stability* to Water | Stability** Visible Rays & Ultraviolet Rays |
|---|---|---|---|---|---|---|
| KRS-5 | NaCl | (1.78 $\mu$m) | AgCl | (2.68 $\mu$m) | | |
| | | | KRS-5 | (2.23 $\mu$m) | | |
| | | | PbF$_2$ | (2.57 $\mu$m) | Δ | |
| | | | Ge | (1.3 $\mu$m) | | |
| | KBr | (1.73 $\mu$m) | GaAs | (1.7 $\mu$m) | | |
| | KCl | (1.83 $\mu$m) | AgBr | (2.41 $\mu$m) | | |
| | | | ZnS | (2.41 $\mu$m) | Δ | |
| | | | Si | (1.63 $\mu$m) | | |
| | | | KRS-6 | (2.44 $\mu$m) | | |
| | | | AgCl | (2.68 $\mu$m) | | |
| | | | KRS-5 | (2.23 $\mu$m) | | |
| AgBr KRS-6 | KCl | (1.83 $\mu$m) | Ge | (1.3 $\mu$m) | | |
| | | | GaAs | (1.7 $\mu$m) | | |
| | | | AgBr | (2.41 $\mu$m) | | |
| | | | ZnS | (2.41 $\mu$m) | Δ | |
| | | | Si | (1.63 $\mu$m) | | |
| | | | KRS-6 | (2.44 $\mu$m) | | |
| CsI | NaF | (2.2 $\mu$m) | Ge | (1.3 $\mu$m) | | |
| | | | GaAs | (1.7 $\mu$m) | | |
| | | | AgCl | (2.68 $\mu$m) | | |

TABLE 4-continued

| Substrate | Inner Layer (Film Thickness) | Outer Layer (Film Thickness) | | Stability* to Water | Stability** Visible Rays & Ultraviolet Rays |
|---|---|---|---|---|---|
| | | AgBr | (2.41 μm) | | |
| | | ZnS | (2.41 μm) | Δ | |
| | | Si | (1.63 μm) | | |
| | | ZnSe | (2.19 μm) | | |

Note:
*Mark    means no change in transmission of $CO_2$ laser beam after standing in humidity of 60% at room temperature for 1 month or longer. (initial transmission: 99% or more)
Mark Δ means no change in transmission of $CO_2$ laser beam after standing under same conditions for 1 week or longer. (initial transmission: 99% or more)
**Mark    means no change in transmission of $CO_2$ laser beam after standing in open air of fine weather for 2 hours. (initial transmission: 99% or more)

As illustrated above in detail, an anti-reflection coating for an infrared transmitting material, which is stable to water or moisture and free from deterioration of the performances for a long period of time, can be formed according to the present invention and moreover, an anti-reflection coating for an infrared transmitting material, which is capable of intercepting visible rays and ultraviolet rays and preventing decomposition of a substrate material as a cutting filter, can be given.

What is claimed is:

1. An infrared transmitting material provided with an anti-reflective material, consisting essentially for an inner layer of an alkali metal halide and an outer layer, provided on the inner layer, of an infrared transmitting material, the inner layer and outer layer being provided on a substrate of an infrared transmitting material and having refractive indexes in the range of the shaded portions in FIG. 2, said refractive indexes of the inner and outer layers in FIG. 2, being based upon the refractive index n of the infrared transmitting substrate, and wherein the infrared transmitting material of the substrate is one member selected from the group consisting of silver bromide, silver chloride and mixed crystals thereof, said alkali metal halide of the inner layer being one member selected from the group consisting or potassium bromide, potassium chloride, sodium chloride, sodium fluoride and mixed crystals thereof; and said infrared transmitting material of the outer layer is one member selected from the group consisting of silver bromide, silver chloride and mixed crystals thereof, lead fluoride, zinc sulfide, zinc selenide, cadmium telluride and gallium arsenide.

* * * * *